United States Patent
Levada

(10) Patent No.: US 10,541,021 B2
(45) Date of Patent: Jan. 21, 2020

(54) APPARATUSES AND METHODS FOR IMPLEMENTING ACCESS LINE LOADS FOR SENSE AMPLIFIERS FOR OPEN ACCESS LINE SENSING

(71) Applicant: MICRON TECHNOLOGY, INC., Boise, ID (US)

(72) Inventor: Simone Levada, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/958,506

(22) Filed: Apr. 20, 2018

(65) Prior Publication Data

US 2019/0325942 A1  Oct. 24, 2019

(51) Int. Cl.
G11C 7/02 (2006.01)
G11C 11/4091 (2006.01)
G11C 11/4094 (2006.01)
G11C 7/08 (2006.01)

(52) U.S. Cl.
CPC ............ G11C 11/4091 (2013.01); G11C 7/08 (2013.01); G11C 11/4094 (2013.01)

(58) Field of Classification Search
CPC .................................................. G11C 11/4097
USPC ...................................................... 365/210.1
See application file for complete search history.

(56) References Cited

U.S. PATENT DOCUMENTS

| 5,737,260 | A | 4/1998 | Takata et al. |
| 6,072,739 | A * | 6/2000 | Kokubo ............... G11C 7/1006 365/203 |
| 6,650,584 | B2 | 11/2003 | Cowles |
| 6,721,198 | B2 | 4/2004 | Kang |
| 6,965,531 | B2 | 11/2005 | Mine |
| 7,586,804 | B2 | 9/2009 | Hwang |
| 7,768,814 | B2 | 8/2010 | Argawal et al. |
| 7,869,274 | B2 | 1/2011 | Fujita et al. |
| 8,514,610 | B2 | 8/2013 | Shin et al. |
| 8,619,484 | B2 * | 12/2013 | Lim ........................ G11C 7/12 365/207 |
| 8,797,816 | B2 | 8/2014 | Jo |
| 9,767,919 | B1 | 9/2017 | He et al. |
| 2005/0146928 | A1 * | 7/2005 | Luk ...................... G11C 11/405 365/175 |

(Continued)

OTHER PUBLICATIONS

Lim, et al., "A 1.2V 23nm 6F 4Gb DDR3 SDRAM with Local-Bitline Sense Amplifier, Hybrid LIO Sense Amplifier and Dummy-Less Array Architecture", IEEE International Solid-State Circuits Conference, Feb. 2012, 3 pgs.

*Primary Examiner* — Min Huang
(74) *Attorney, Agent, or Firm* — Dorsey & Whitney LLP

(57) ABSTRACT

Apparatuses and methods for implementing access line loads for sense amplifiers for open access line sensing. An example apparatus may include a memory array comprising a plurality of sense amplifiers. A first sense amplifier is coupled to a first access line segment and to a second access line segment and a second sense amplifier is coupled to a third access line segment and to a load segment. The first, second, and third access line segments are coupled to a respective plurality of memory cells. The load segment comprise load circuitry configured to provide a capacitive load to the second sense amplifier based on a capacitive load of the third access line segment.

8 Claims, 5 Drawing Sheets

(56) References Cited

U.S. PATENT DOCUMENTS

2009/0168576 A1* 7/2009 Fujita .................. G11C 11/404
365/207
2011/0211410 A1 9/2011 Kim
2017/0372795 A1 12/2017 He et al.

* cited by examiner

APPARATUSES AND METHODS FOR IMPLEMENTING ACCESS LINE LOADS FOR SENSE AMPLIFIERS FOR OPEN ACCESS LINE SENSING

BACKGROUND

Current implementations of dynamic random-access memory (DRAM) device arrays implement row segment sections where row segments of memory cells are interleaved. Sense amplifiers are connected to sequential row segments, and use one of the two row segments as reference when reading the other row segment. As a result, at the edges of an array, the row segments sections include border row segments. These border segments are interleaved with other row segment sections, but the other row segment sections are not connected to circuitry that allows them to be used for storing data. Therefore, in these border row segment sections, only half of the memory cells in the section are used to store data. Because only half of the memory cells are used, significant area around the edge of an array are consumed by unused memory cells.

DETAILED DESCRIPTION

Certain details are set forth below to provide a sufficient understanding of embodiments of the disclosure. However, it ill be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
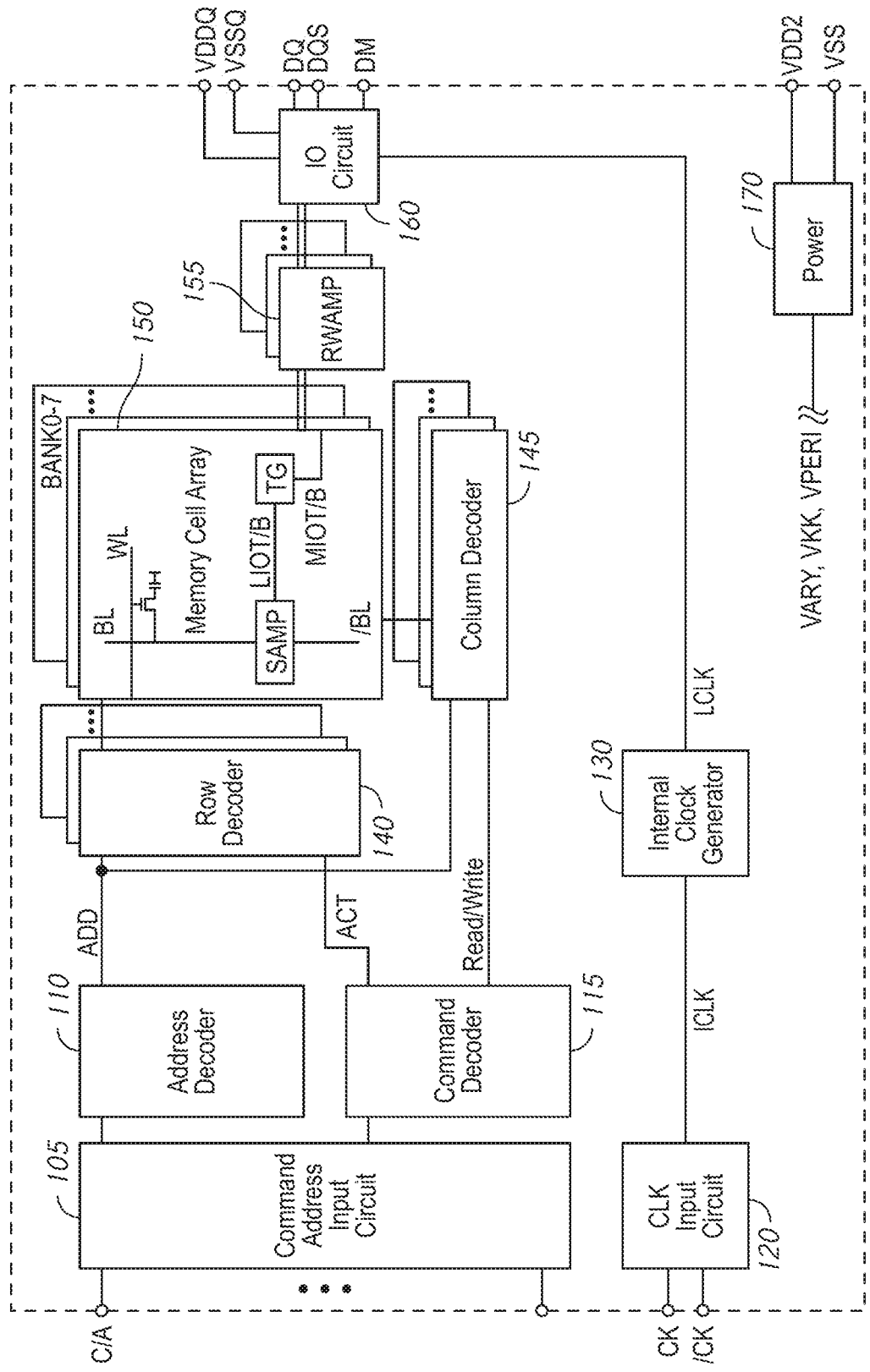
FIG. 1 illustrates a schematic block diagram of a semiconductor device in accordance with an embodiment of the present disclosure.

FIG. 1 illustrates a schematic block diagram of a semiconductor device 100 in accordance with an embodiment of the present disclosure. The semiconductor device 100 includes a memory die. The memory die may include a command/address input circuit 105, an address decoder 110, a command decoder 115, a clock input circuit 120, internal clock generator 130, row decoder 140, column decoder 145, memory arrays 150, read/write amplifiers 155, I/O circuit 160, and power circuit 170.

In some embodiments, the semiconductor device 100 may include, without limitation, a dynamic random-access memory (DRAM) device, such as double data rate (DDR) DDR4, DDR5, low power DDR (LPDDR), Graphics DDR (GDDR) GDDR5, GDDR5X, GDDR6, integrated into a single semiconductor chip, for example. The die may be mounted on an external substrate, for example, a memory module substrate, a mother board or the like. The semiconductor device 100 may further include a memory array 150.

The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line (LIOT/B), which is in turn coupled to a respective one of at least two main I/O line pairs (MIOT/B), via transfer gates (TG), which function as switches.

When an access operation is performed, the sense amplifiers sense a voltage difference between a BL to which an accessed memory cell (and the sense amplifier) is coupled and a reference voltage, and amplify the difference. The sense amplifiers may use the other BL to which the sense amplifier is coupled to provide the reference voltage. In some embodiments, the sense amplifiers adjacent to a border of the memory array 150 may be coupled to a one bit line BL segment and to a load segment rather than being coupled to (e.g., between) two bit line BL segments. The load segment may be used as a reference segment to provide the reference voltage when reading the one bit line segment. In some examples, the load segments may include circuitry configured to approximate the capacitance of a bit line BL segment. For example, the load segments may include capacitors or other circuitry that adds a capacitance load to the load segment. In some examples, the load segment may include tunable circuitry that is configured to adjust the capacitance of the load segment. During an initial setup or during an initialization process, the tunable circuitry may selectively activate or connect load circuitry by selectively providing a reference voltage to the load circuitry or selectively adjusting the reference voltage in order to adjust a capacitance of the load segment. In some examples, the load circuitry may include metal-oxide semiconductor field-effect transistors (MOSFETs) that are operated in a diode configuration.

The semiconductor device 100 may employ a plurality of external terminals that include address and command terminals coupled to command/address bus (C/A), clock terminals CK and /CK, data terminals DQ, DQS, and DM, power supply terminals VDD2, VSS, VDDQ, and VSSQ.

The command/address terminals may be supplied with an address signal and a bank address signal from outside. The address signal and the bank address signal supplied to the address terminals are transferred, via the command/address input circuit 105, to an address decoder 110. The address decoder 110 receives the address signal and decodes the address signal to provide decoded address signal ADD. The ADD signal includes a decoded row address signal and a decoded column address signal. The decoded row address signal is provided to the row decoder 140, and a decoded column address signal is provided to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory array 150 designated by these row address and column address. The read data DQ is output to outside from the data terminals DQ (data), DQS (data strobe), and DM (data mask) via read/write amplifiers 155 and an input/output circuit 160. Similarly, when the write command is issued and a row address and a column address are timely supplied with this command, and then write data is supplied to the data terminals DQ, DQS, DM, the write data is received by data receivers in the input/output circuit 160, and supplied via the input/output circuit 160 and the read/write amplifiers 155 to the memory array 150 and written in the memory cell designated by the row address and the column address.

Turning to the explanation of the external terminals included in the semiconductor device 100, the clock terminals CK and/CK are supplied with an external clock signal and a complementary external clock signal, respectively. The external clock signals (including complementary external clock signal) may be supplied to a clock input circuit 105. The clock input circuit 105 may receive the external clock signals to generate an internal clock signal ICLK. The internal clock signal ICLK is supplied to an internal clock generator 130 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 130. The phase controlled internal clock signal LCLK is supplied to the input/output circuit 160 and is used as a timing signal for determining an output timing of read data.

The power supply terminals are supplied with power supply potentials VDD and VSS. These power supply potentials VDD2 and VSS are supplied to an internal voltage generator circuit 170. The internal voltage generator circuit 170 generates various internal potentials VARY, VKK, VPERI, and the like based on the power supply potentials VDD2 and VSS. The internal potential VARY is mainly used in the sense amplifiers included in the memory array 150, the internal potential VKK is mainly used in the row decoder 140, and the internal potential VPERI is used in many other circuit blocks.

The power supply terminals are also supplied with power supply potentials VDDQ and VSSQ. These power supply potentials VDDQ and VSSQ are supplied to the input/output circuit 160. The power supply potentials VDDQ and VSSQ are typically the same potentials as the power supply potentials VDD2 and VSS, respectively. However, the dedicated power supply potentials VDDQ and VSSQ are used for the input/output circuit 160 so that power supply noise generated by the input/output circuit 160 does not propagate to the other circuit blocks.

Figure 2:
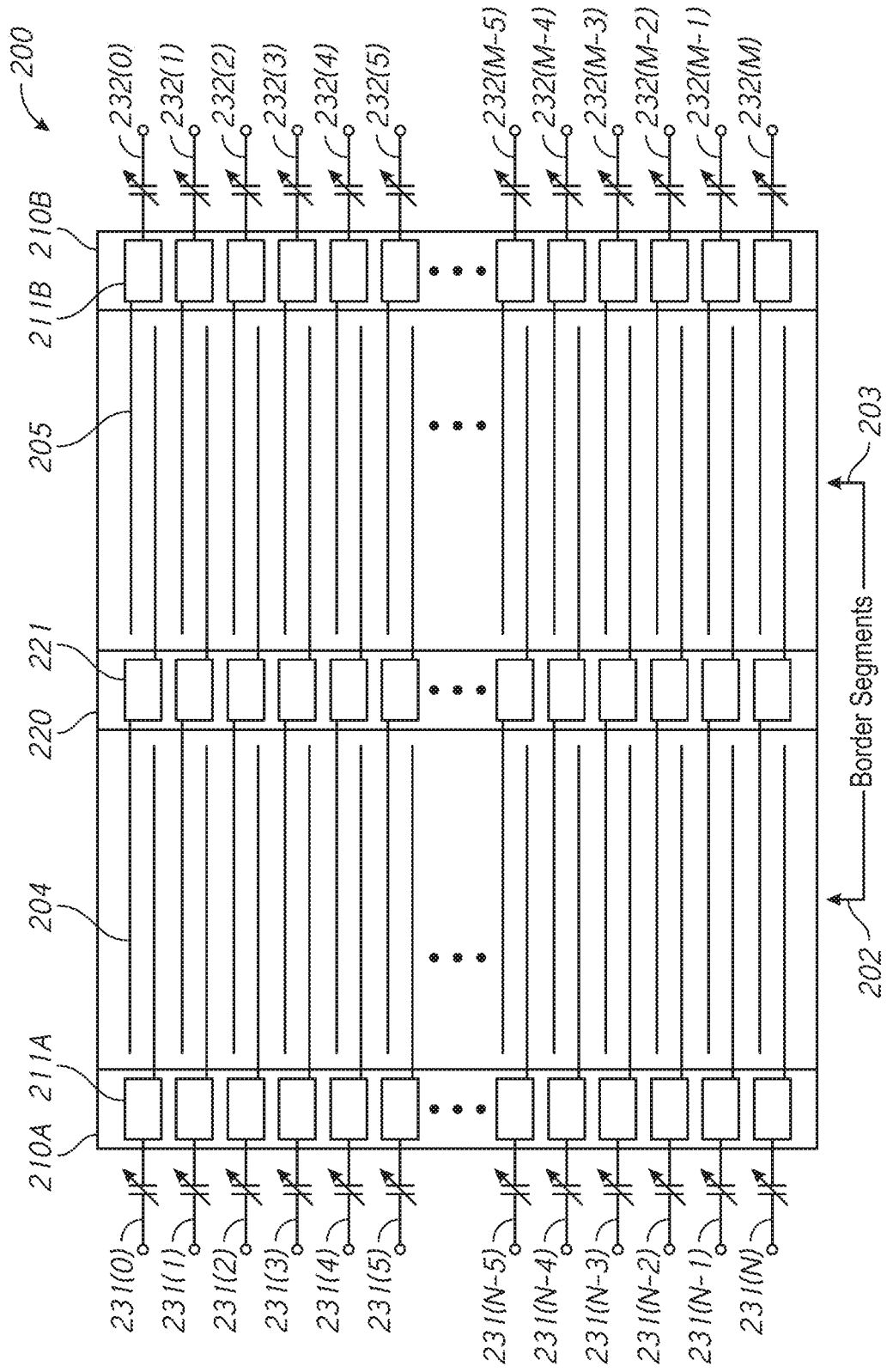
FIG. 2 illustrates a schematic block diagram of a portion of a memory array in accordance with an embodiment of the disclosure.

FIG. 2 illustrates a schematic block diagram of a portion of a memory array 200 in accordance with an embodiment of the disclosure. The memory array 200 includes a first border segment 202, a second border segment 203, a sense amplifier bank 210A, a sense amplifier bank 210B, a sense amplifier bank 220, a load segment bank 230A, and a load segment bank 230B. Any of the memory arrays 150 of FIG. 1 may implement the memory array 200.

The first border segment 202 and the second border segment 203 each include individual balanced access line (e.g., bit line or digit line) segments 204 and unbalanced access line segments 205 interleaved with each other. The use of the term "balanced" may refer to access lines that are paired with another corresponding access line segment 204 via a sense amplifier 221 of the sense amplifier bank 220 to act as a reference during an access operation. The use of the term "unbalanced" may refer to access lines that, rather than paired with another access line segment, are instead paired with one of the load segments 231(0)-(N) of the load segment bank 230A or one of the load segments 232(0)-(N) of the load segment bank 230B via a sense amplifier 211A of the sense amplifier bank 210A or a sense amplifier 211B of the sense amplifier bank 210B, respectively, to act as a reference during an access operation. Each of the balanced access line segments 204 and the unbalanced access line segments 205 are coupled to a respective plurality of memory cells (not shown) that may be used to store data. Each plurality of memory cells are implemented along a corresponding one of the balanced access line segments 204 or unbalanced access line segments 205.

The sense amplifier bank 220 includes a plurality of sense amplifiers 221. Each of the sense amplifiers 221 is coupled to a respective pair of the balanced access line segments 204; one in each of the first border segment 202 and the second border segment 203. During an access of a memory cell, each sense amplifier 221 uses one of the balanced access line segments 204 as a reference to access the other balanced access line segment 204. For example, for an access operation associated with a memory cell along a balanced access line segment 204 of the first border segment 202, the sense amplifiers 221 may use the balanced access line segments 204 of the second border segment 203 as a reference during the access operation. The sense amplifiers 221 are coupled to downstream circuitry through transfer gates (not shown) to provide and receive data during an access operation.

The sense amplifier bank 210A includes a plurality of sense amplifiers 211A. Each of the sense amplifiers 211A are coupled to a respective one of the unbalanced access line segments 205 of the first border segment 202, and to a respective one of the load segments 231(0)-(N) of the load segment bank 230A. During an access of a memory cell attached to the respective unbalanced access line segments 205 of the first border segment 202, each sense amplifier 211A uses the respective one of the load segments 231(0)-(N) of the load segment bank 230A as a reference. For example, for an access operation associated with a memory cell along an unbalanced access line segments 205 of the first border segment 202, the sense amplifiers 211A may use the respective one of the load segments 231(0)-(N) of the load segment bank 230A as a reference during the access operation. The sense amplifiers 211A are coupled to downstream circuitry through transfer gates (not shown) to provide and receive data during an access operation.

The sense amplifier bank 210B includes a plurality of sense amplifiers 211B. Each of the sense amplifiers 211B are coupled to a respective one of the unbalanced access line segments 205 of the second border segment 203, and to a respective one of the load segments 232(0)-(N) of the load segment bank 230B. During an access of a memory cell attached to the respective unbalanced access line segments 205 of the second border segment 203, each sense amplifier 211B uses the respective one of the load segments 232(0)-(N) of the load segment bank 230B as a reference. For example, for an access operation associated with a memory cell along an unbalanced access line segments 205 of the second border segment 203, the sense amplifiers 211B may use the respective one of the load segments 232(0)-(N) of the load segment bank 230B as a reference during the access operation. The sense amplifiers 211B are coupled to downstream circuitry through transfer gates (not shown) to provide and receive data during an access operation.

Each of the load segments 231(0)-(N) of the load segment bank 230A and the load segments 232(0)-(N) of the load segment bank 230B may include load circuitry configured to add a capacitive load to the respective load segment. In some examples, the load circuitry may be tunable such that the capacitive load applied to the load segment may be adjusted. The capacitive load adjustment may include selectively coupling a reference voltage to circuit components of the load circuitry, adjusting the reference voltage provided to the load circuitry of the load segment, or combinations thereof. The load circuitry may include capacitors, MOSFETs operated in a diode mode, other circuitry configured add a capacitive load, or a combination thereof.

In operation, the memory array 200 is configured to store data in memory cells of the first border segment 202 and the second border segment 203. The sense amplifiers 211A of the sense amplifier bank 210A, the sense amplifiers 211B of the sense amplifier bank 210B, and the sense amplifiers 221 of the sense amplifier bank 220 are configured to perform memory access operations associated with memory cells of the memory array 200. During a read operation, the sense amplifiers 221 perform access operations associated with memory cells attached to the respective ones of the balanced access line segments 204 within either the first border segment 202 or the second border segment 203. Similarly, the sense amplifiers 211A perform access operations associated with memory cells attached to the respective ones of the unbalanced access line segments 205 of the first border segment 202, and the sense amplifiers 211B perform access operations associated with memory cells attached to the respective ones of the unbalanced access line segments 205 of the second border segment 203. For example, for an access operation associated with a memory cell along an balanced access line segments 204 of the first border segment 202, the sense amplifiers 221 may use the balanced access line segments 204 of the second border segment 203 as a reference during the access operation. Similarly, for an access operation associated with a memory cell along an balanced access line segments 204 of the second border segment 203, the sense amplifiers 221 may use the balanced access line segments 204 of the first border segment 202 as a reference during the access operation. The capacitance load of each of the balanced access line segments 204 and the unbalanced access line segments 205 in both the first border segment 202 and the second border segment 203 may be approximately equal, so one balanced access line segments 204 may be used as a reference load when reading another balanced access line segments 204.

For the sense amplifiers 211A and the sense amplifiers 211B, rather than using another access line segment as a reference line to perform an access operation, the sense amplifiers 211A and the sense amplifiers 211B instead use the load segments 231(0)-(N) of the load segment bank 230A and the load segments 232(0)-(N) of the load segment bank 230B, respectively, to perform the access operations. The load segments 231(0)-(N) of the load segment bank 230A and the load segments 232(0)-(N) of the load segment bank 230B may be constructed differently than the balanced access line segments 204 or the unbalanced access line segments 205 (e.g., have different lengths, components, voltages, etc.). To help achieve comparable sensing performance to the sensing performance of the sense amplifiers 221, the load segments 231(0)-(N) and the load segments 232(0)-(N) may each be configured to provide a capacitive load that is similar to the capacitive load of one of the unbalanced access line segments 205.

In some examples, the load segments 31(0)-(N) of the load segment bank 230A and the load segments 232(0)-(N) of the load segment bank 230B may be tuned to achieve a desired capacitive load. For example, the load segments 231(0)-(N) and the load segments 232(0)-(N) may include respective circuit components that can be selectively coupled to a reference voltage to provide a capacitive load.

In another example, the load segments 231(0)-(N) and the load segments 232(0)-(N) may include circuit components that have a voltage-adjustable capacitance load. For example, the load segments 231(0)-(N) and the load segments 232(0)-(N) may include MOSFETs that are operated in a diode configuration, where trimmable reference voltage (e.g., provided to a source/gate voltage) moves the MOSFETs within the depletion region, effectively changing the capacitive load. The load segments 231(0)-(N) and the load segments 232(0)-(N) may be tuned to set balanced (e.g., access line precharge voltage margin from a midpoint for 0's is similar to access line precharge voltage margin from the midpoint for 1's) and wide sense margins for the sense amplifiers 211A and the sense amplifiers 211B, respectively. Tuning may include sensing 1's (e.g., high values) and Os (e.g., low values) stored in the memory cells attached to the unbalanced access line segments 205 using various access line precharge voltage values (e.g., incrementally increasing for the 1's and incrementally decreasing for the Os) until the sense amplifiers 211A and the sense amplifiers 211B are unable to reliably sense stored data. If the sense margins are unbalanced or narrow, the load segments 231(0)-(N) and the load segments 232(0)-(N) may be tuned to adjust capacitive load and adjust the corresponding sense margins.

In some examples, the load segments 231(0)-(N) and the load segments 232(0)-(N) may include any combination of fixed (e.g., always coupled) circuit components, circuit components that can be selectively coupled to the reference voltage, or circuit components that have a voltage-adjustable capacitance load. It is noted that the count of the sense amplifiers 221, the sense amplifiers 211A, and the sense amplifiers 211B are exemplary, and may include more of fewer sense amplifiers without departing from the scope of the disclosure. The memory array 200 implementing the load segments 231(0)-(N) and the load segments 232(0)-(N) may be more space-efficient, compared to a conventional implementation that includes typical row segments.

Figure 3:
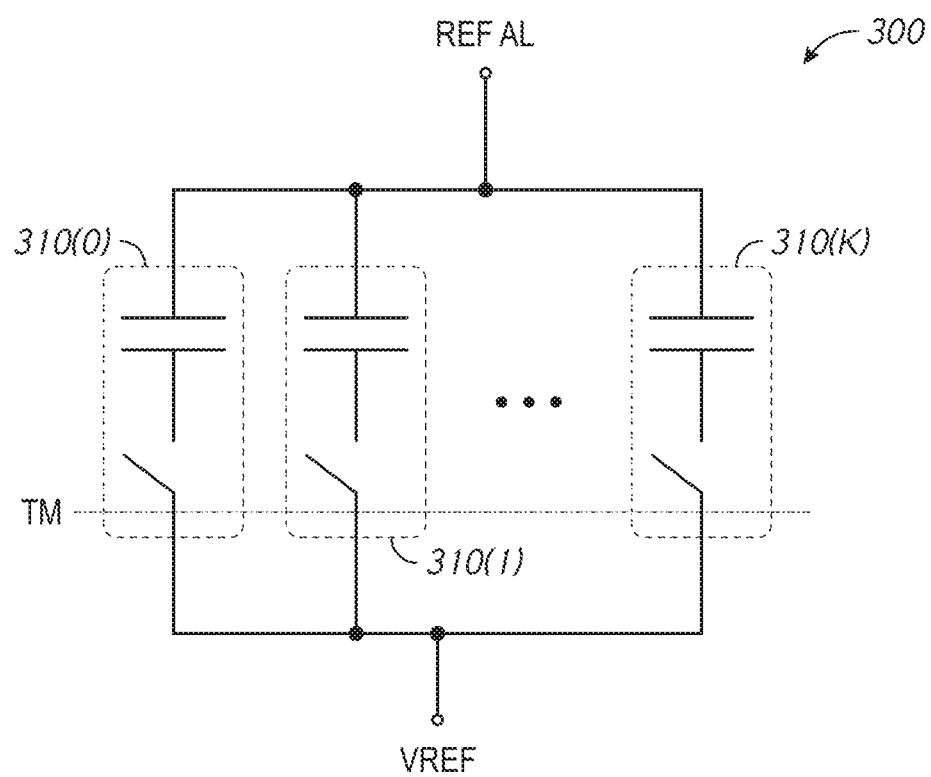
FIG. 3 illustrates a schematic block diagram of a load circuit in accordance with an embodiment of the disclosure.

FIG. 3 illustrates a schematic block diagram of a load circuit 300 in accordance with an embodiment of the disclosure. Any of the memory arrays 150 of FIG. 1 and/or any of the load segments 231(0)-(N) and/or the load segments 232(0)-(N) of FIG. 2 may implement the load circuit 300.

The load circuit 300 includes selectable capacitive circuits 310(0)-(K) coupled between a reference access line REF AL and a reference voltage VREF. The reference access line REF AL may be coupled to a respective sense amplifier (e.g., sense amplifiers 211A and/or 211B of FIG. 2). The selectable capacitive circuits 310(0)-(K) may include a switch component controlled by a respective test mode TM signal and a capacitive component. The capacitive components may include a capacitor, a MOSFET configured in a diode mode, or combinations thereof. The selectable capacitive circuits 310(0)-(K) may be selectively activated via the respective TM signal to couple the VREF voltage to the capacitive component. The switches of the selectable capacitive circuits 310(0)-(K) may each receive a different respective one of the TM signals to allow individual/independent activation (e.g., coupling to the VREF voltage) of the capacitive components of the selectable capacitive circuits 310(0)-(K). The TM signal may be provided to a subset of the selectable capacitive circuits 310(0)-(K). In some examples, fewer of the selectable capacitive circuit components 310(0)-(K) may be activated (e.g., coupled to the VREF voltage) to decrease a capacitive load provided to the reference access line REF AL. Additionally, more of the selectable capacitive circuit components 310(0)-(K) may be activated to increase a capacitive load provided to the reference access line REF AL.

Figure 4:
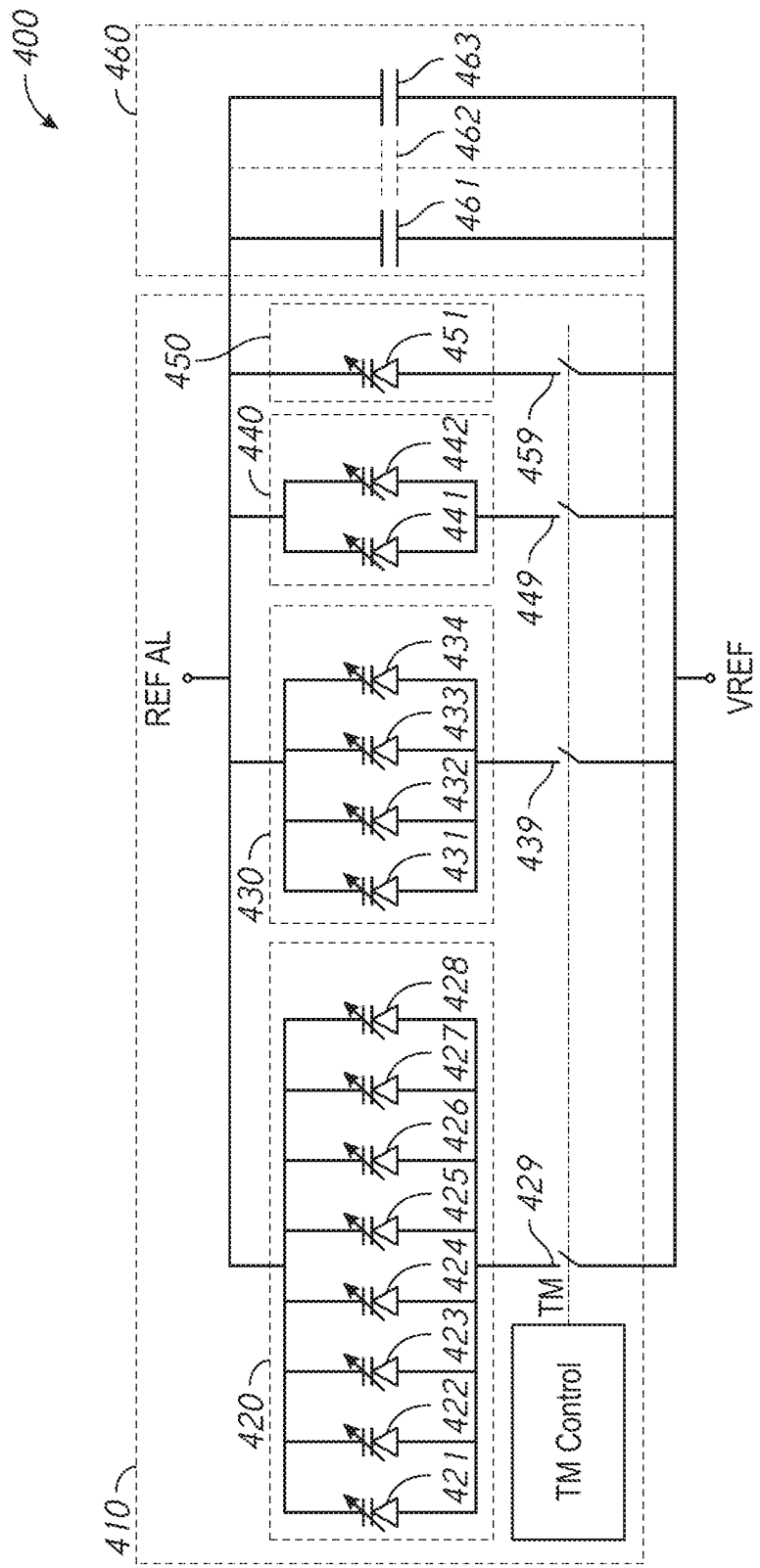
FIG. 4 illustrates a schematic block diagram of a load circuit in accordance with an embodiment of the disclosure.

FIG. 4 illustrates a schematic block diagram of a load circuit 400 in accordance with an embodiment of the disclosure. Any of the memory arrays 150 of FIG. 1 and/or any of the load segments 231(0)-(N) and/or the load segments 232(0)-(N) of FIG. 2 may implement the load circuit 400. The load circuit 400 includes a first capacitive load circuitry 410 and a second capacitive load circuitry 460 coupled between a reference voltage VREF and a reference access line REF AL. The reference access line REF AL may be coupled to a respective sense amplifier (e.g., sense amplifiers 211A and/or 211B of FIG. 2).

The first capacitive load circuitry 410 include a first transistor bank 420, a second transistor bank 430, a third transistor bank 440 and a fourth transistor bank 450 (e.g., a single MOSFET 451) that are each selectively coupled to the VREF voltage via the switch 429, switch 439, switch 449, and switch 459, respectively. The first transistor bank 420 includes 8 MOSFETs 421-428 arranged in a diode configuration. The second transistor bank 430 includes 4 MOSFETs 441-444 arranged in a diode configuration. The third transistor bank 440 includes 2 MOSFETs 441-442 arranged in a diode configuration. The fourth transistor bank 450 includes 1 MOSFET 451 arranged in a diode configuration. Together, the first transistor bank 420, the second transistor bank 430, the third transistor bank 440, and the fourth transistor bank 450 offer a binary application that allows activation of between 0 and 15 MOSFETs via the switches 429, 439, 449, and 459. The switches 429, 439, 449, and 459 may operate based on the test mode TM signals. Each of the switches 429, 439, 449, and 459 may be coupled to a different respective TM signal to provide an ability to independent control the switches 429, 439, 449, and 459. The individual capacitance of each of the MOSFETs 421-428, 431-434, 441-442, and 451 may be adjusted by adjusting the VREF voltage. That is, the capacitance of each of the MOSFETs 421-428, 431-434, 441-442, and 451 may be based on a working condition within the depletion region at which the MOSFETs 421-428, 431-434, 441-442, and 451 are operating. Changing the VREF voltage changes a working condition within the depletion region for the MOSFETs.

The second capacitive load circuitry 460 may include capacitors 461, 462, 463 that provide a fixed capacitive load to the reference access line REF AL. The load circuitry 460 may be used to provide a minimum capacitive load for the load circuit 400. In some examples, the capacitive load provided by each of the capacitors 461, 462, 463 is greater than a capacitive load provided by each of the MOSFETs 421-428, 431-434, 441-442, and 451. Together, active components of the first capacitive load circuitry 410 and the second capacitive load circuitry 460 may approximate a capacitive load of an access line segment. Adjustments to the capacitive load provided by the first capacitive load circuitry 410 and the second capacitive load circuitry 460 may include both selectively activating the switch 429, switch 439, switch 449, and switch 459 and adjusting the VREF voltage.

Figure 5:
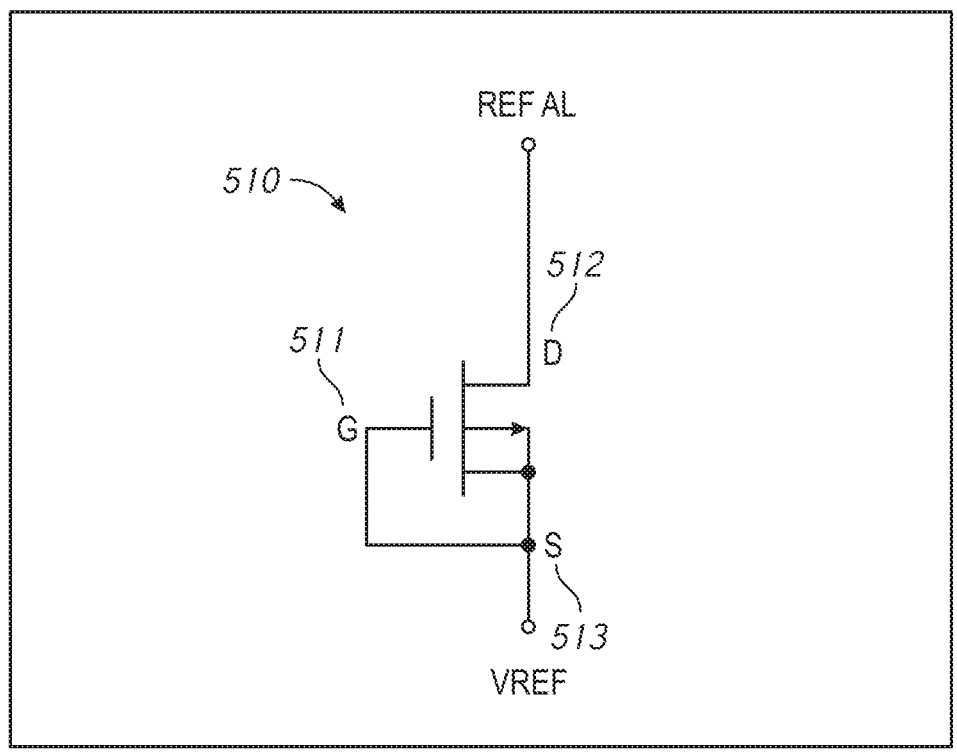
FIG. 5 illustrates a schematic block diagram of a transistor configured in a diode configuration in accordance with an embodiment of the disclosure.

FIG. 5 illustrates a schematic block diagram of a transistor 510 configured in a diode configuration in accordance with an embodiment of the disclosure. Any of the load segments 231(0)-(N) and the load segments 232(0)-(N) of FIG. 2, the selectable capacitive circuits 310(0)-(K) of FIG. 3, the MOSFETs 421-428, 431-434, 441-442, and 451 of FIG. 4 may implement the transistor 510.

The transistor 510 may include a source 513 that is coupled to a gate 511, which are both coupled to a reference voltage VREF. The transistor 510 may also include a drain 512 that is coupled to a reference access line REF AL. The reference access line REF AL may be coupled to a respective sense amplifier (e.g., sense amplifiers 211A and/or 211B of FIG. 2). During operation, the gate 511 coupled to the source 513 configures the transistor 510 to operate as a diode, where the capacitive load exhibited by the transistor 510 changes based on the working condition within the depletion region of the transistor 510. Adjusting the VREF voltage adjusts the working condition within the depletion region of the transistor 510, and therefore adjusts the capacitive load.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
    a memory array comprising a plurality of sense amplifiers configured for open bit line sensing, wherein a sense amplifier of the plurality of sense amplifiers is coupled between a respective one of a load segment of a plurality of load segments and a respective access line segment of a plurality of access line segments, wherein the access line segment is coupled to a respective plurality of memory cells, wherein the sense amplifier is configured to use the load segment as a reference to sense data of a memory cell of the plurality of memory cells during a memory access operation, wherein the load segment includes load circuitry configured with a capacitive load that is based on a capacitive load of the access line segment, wherein the capacitive load of the load segment is tunable, wherein the capacitive circuitry is tuned based on high and low read thresholds sensed by the sense amplifier.

2. The apparatus of claim 1, wherein the capacitive circuitry is tuned by selectively activating one or more capacitive components of the capacitive circuitry, adjusting a reference voltage provided to the capacitive circuitry, or combinations thereof.

3. The apparatus of claim 1, wherein the capacitive circuitry comprises a plurality of transistors configured in a diode configuration to provide a portion of the capacitive load.

4. The apparatus of claim 3, wherein the plurality of transistors are metal-oxide semiconductor field-effect transistors.

5. A method comprising:
    sensing high and low read thresholds using a sense amplifier of a memory array configured for open access line sensing, wherein the sense amplifier is coupled between an access line segment and a load segment, wherein the access line segment is coupled to a plurality of memory cells; and
    adjusting a capacitive load provided by load circuitry of the load segment based on the sensed high and low read thresholds.

6. The method of claim 5, wherein adjusting the capacitive load provided by load circuitry of the load segment comprises selectively activating one or more capacitive components of capacitive circuitry of the load segment.

7. The method of claim 5, wherein adjusting the capacitive load provided by load circuitry of the load segment comprises adjusting a reference voltage provided to capacitive circuitry of the load segment.

8. The method of claim 5, wherein the capacitive circuitry comprises a plurality of metal-oxide semiconductor field-effect transistors configured in a diode configuration to provide a portion of the capacitive load.

* * * * *